(12) United States Patent
Reykowski

(10) Patent No.: US 9,207,297 B2
(45) Date of Patent: Dec. 8, 2015

(54) SYSTEM AND METHOD FOR A MODE BALANCED PARAMETRIC AMPLIFIER

(71) Applicant: KONINKLIJKE PHILIPS N.V., Eindhoven (NL)

(72) Inventor: Arne Reykowski, Newberry, FL (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/421,080

(22) PCT Filed: Aug. 2, 2013

(86) PCT No.: PCT/IB2013/056345
§ 371 (c)(1),
(2) Date: Feb. 11, 2015

(87) PCT Pub. No.: WO2014/030084
PCT Pub. Date: Feb. 27, 2014

(65) Prior Publication Data
US 2015/0204954 A1 Jul. 23, 2015

Related U.S. Application Data

(60) Provisional application No. 61/691,985, filed on Aug. 22, 2012.

(51) Int. Cl.
*G01R 33/36* (2006.01)
*H03F 7/04* (2006.01)
*G01R 33/34* (2006.01)

(52) U.S. Cl.
CPC ...... *G01R 33/3614* (2013.01); *G01R 33/34092* (2013.01); *H03F 7/04* (2013.01)

(58) Field of Classification Search
CPC ............... G01R 33/34092; G01R 33/3614; H03F 7/04
See application file for complete search history.

(56) References Cited

U.S. PATENT DOCUMENTS 3,105,941 A   10/1963  Kliphuis
3,710,268 A    1/1973  Neuf
(Continued)

FOREIGN PATENT DOCUMENTS

GB    2469153 A      10/2010
SU     375027 A       6/1974
WO  2006103635 A1   10/2006

OTHER PUBLICATIONS

Hayasi, S. et al "A Balanced-Type Parametric Amplifier" IRE Transactions on Microwave Theory and Techniques, IEEE, vol. 6, No. 3, May 1962, pp. 185-190.

(Continued)

*Primary Examiner* — Dixomara Vargas

(57) ABSTRACT

The exemplary embodiments are related to systems and methods for a mode balanced parametric amplifier. Exemplary embodiments relate to a balanced parametric circuit including a first resonant structure including a first plurality of varactor diodes and a second resonant structure including a second plurality of varactor diodes. The first and second resonant structures are coupled to form a coupled structure having at least two orthogonal resonant modes, where a first resonant mode is resonant at a first frequency of an input signal and a second resonant mode is resonant at a second frequency of a pump signal. Further, the pump signal is used to one of amplify the first signal at the first frequency or mix and amplify the first signal to a frequency higher than the first frequency.

16 Claims, 7 Drawing Sheets

(56) References Cited

U.S. PATENT DOCUMENTS

| | | |
|---|---|---|
| 6,906,520 B2 | 6/2005 | Heid |
| 7,764,065 B2 * | 7/2010 | Biber et al. .................. 324/318 |
| 8,049,501 B2 * | 11/2011 | Hancu et al. ................. 324/318 |
| 8,125,226 B2 * | 2/2012 | Wong et al. .................. 324/318 |
| 8,138,761 B2 | 3/2012 | Evans |
| 2007/0207763 A1 | 9/2007 | Bollenbeck |
| 2011/0059716 A1 | 3/2011 | Cork |

OTHER PUBLICATIONS

Gray, Blake et al "A Broadband Double-Balanced Phase-Coherent Degenerate Parametric Amplifier", IEEE Microwave and Wireless Components Letters, vol. 21, No. 11, Nov. 2011, pp. 607-609.

Qian, Chunqi et al "Sensitivity Enhancement of Remotely Coupled NMR Detectors using Wirelessly Powered Parametric Amplification", Magnetic Resonance in Medicine, 2011.

* cited by examiner

SYSTEM AND METHOD FOR A MODE BALANCED PARAMETRIC AMPLIFIER

CROSS-REFERENCE TO PRIOR APPLICATIONS

This application is the U.S. National Phase application under 35 U.S.C. §371 of International Application No. PCT/IB2013/056345, filed on Aug. 2, 2013, which claims the benefit of U.S. Provisional Patent Application No. 61/691,985, filed on Aug. 22, 2012. These applications are hereby incorporated by reference herein.

A parametric amplifier may be defined as a high-frequency amplifier wherein the operation is based on time variations in a parameter, such as reactance, and which converts the energy at the frequency of an alternating current into energy at the input signal frequency in such a way as to amplify the signal. Most conventional transistor-based low-noise amplifiers require a direct-current ("DC") power source, wherein its gain is normally flat and its noise factor is low. In contrast, parametric amplifiers operate by energy transferred from an alternating source (e.g., "pumping signal") that is not DC, but may be at a frequency that is lower, the same or higher as the signal to be amplified. For instance, it is possible to generate parametric amplification with a local oscillator that is at a lower frequency than that of the signal, such as with a Lower Side Band Down Converter ("LSBDC"). Furthermore, parametric amplification may also be generated with a local oscillator that is at a higher frequency, such as an Upper Side Band Up Converter ("USBUC"). Accordingly, parametric amplifiers differ from conventional transistor amplifiers in their use of nonlinear energy storage elements rather than nonlinear energy dissipation elements. Furthermore, parametric amplifiers may obtain power from an externally applied radio frequency ("RF") magnetic field. The pumping signal may be used either to amplify a weak signal at the same frequency or to mix and amplify the signal to a higher frequency.

Within the field of medical imaging, parametric amplification is considered as a method for the detection of magnetic resonance imaging ("MRI") signals. Parametric amplifiers may be used to amplify these signals through the use of non-linear reactive elements, such as varactor diodes, in order to convert power at one frequency to power at another frequency. As the mixing process ideally involves no resistive losses, the parametric amplifier may serve as a very low noise device.

During parametric amplification, an input signal at frequency $F_s$ is mixed with a pump signal at frequency $F_p$. The output signal may be picked up at any frequency $N \cdot F_s + M \cdot F_p$. In a conventional Parametric Up Converter, $F_s + F_p$ is typically chosen as the output frequency. Power gain is accomplished by transferring energy from the pump signal to the output signal. This is different from conventional amplifiers, wherein the gain is accomplished by transferring energy from a supply line. For maximum gain and lowest noise figure of the parametric amplifier, it is advantageous for the three signals at $F_s$, $F_p$ and $F_s + F_p$ to be well isolated from each other and for all other frequency products to be reactively terminated with minimum dissipation.

Since the three signals $F_s$, $F_p$ and $F_s + F_p$ are at different frequencies, a separation and isolation may be achieved with filters. However, because the pump signal is typically of a much higher amplitude than both the input signal at $F_s$ and the desired output signal at $F_s + F_p$, such filters may need to provide high isolation. Accordingly, requiring these filters to be of a high order can cause significant losses in the parametric amplifier.

Figure 1:
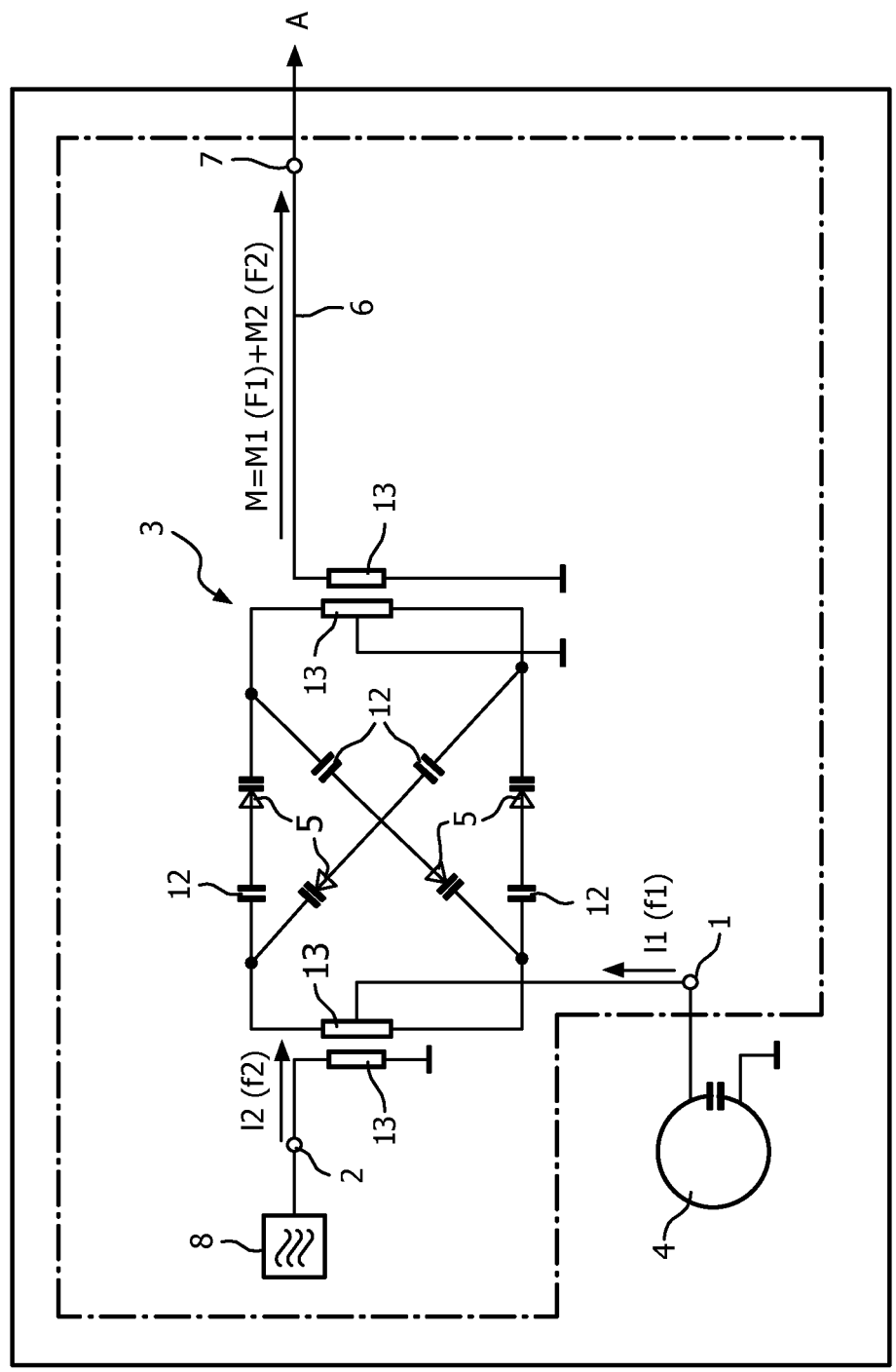
FIG. 1 shows a typical implementation of a balanced system within a double balanced mixer circuit (Model 100).

A potential solution to this problem would be to build a balanced system providing natural isolation between the three signals. Residual cross talk between the signals may then be removed with low order filters that have significantly lower loss. For instance, a typical implementation of such a balanced system may be achieved from double balanced mixer circuits. FIG. 1 provides an illustration of a double balanced mixer circuit (Model 100) concept implemented into parametric amplification.

In FIG. 1, the circuit includes a first input signal ($I_1$) having a first input frequency ($f_1$) that is fed into a balanced frequency mixer 3 via input 1. A second input signal ($I_2$) having a second input frequency ($f_2$) is fed into the balanced frequency mixer 3 via input 2. The balanced frequency mixer 3 may include capacitors 12 and at least two amplifier elements 5 that mix input signals $I_1$ and $I_2$ into a mix signal (M). The mix signal (M) includes a first signal component ($M_1$) exhibiting a first component frequency ($F_1$) and a second signal component ($M2$) exhibiting a second component frequency ($F_2$). The first component frequency ($F_1$) is equal to the sum of the two input frequencies ($f_1, f_2$), and the second component frequency ($F_2$) is equal to the difference of the two input frequencies ($f_1, f_2$). The mix signal (M) is fed into an output line 6 that proceeds to an output 7, wherein the output signal (A) is trapped. The output signal (A) has at least one of the two signal components ($M_1, M_2$) of the mix signal (M).

The exemplary amplifier elements 5 may be varactor diodes that intrinsically amplify the first input signal $I_1$. Therefore, the mixer circuit may include no further amplifier elements aside from the varactor diodes. In addition, it is possible to feed the second input signal $I_2$ from the outside, such as from a signal generator 8 connected to the second input 2 for generating the second input signal $I_2$.

The balanced frequency mixer 3 may also include a signal acquisition arrangement 4 for receiving an input signal at a first frequency a signal generator 8 for generating a pump signal at a second frequency. Furthermore, the balancing of the balanced frequency mixer 3 may be achieved, for example, via a plurality of repeaters 13.

As will be described in greater detail below, an exemplary balanced parametric amplifier is provided on a structure with at least two orthogonal modes. Any of the exemplary resonant modes of the structure can also serve as an antenna to either receive or transmit signals. The resonant frequencies for each of the exemplary modes are adjusted to the frequencies of the signals involved in the parametric amplification, such as the input signal (e.g., input frequency $f_s$), the pump signal (e.g., input frequency $f_p$) and the output signal (e.g., output frequency $f_s + f_p$). While these modes share non-linear reactances, these modes may be otherwise decoupled.

The exemplary embodiments are related to systems and methods for a mode balanced parametric amplifier. One embodiment relates to a balanced parametric circuit including a first resonant structure including a first plurality of varactor diodes and a second resonant structure including a second plurality of varactor diodes, the first and second resonant structures are coupled to form a coupled structure having at least two orthogonal resonant modes, wherein a first resonant mode is resonant at a first frequency of an input signal and a second resonant mode is resonant at a second frequency of a pump signal, wherein the pump signal is used to one of amplify the first signal at the first frequency or mix and amplify the first signal to a frequency higher than the first frequency.

A further embodiment relates to a system including a signal acquisition arrangement receiving an input signal at a first frequency, a signal generator generating a pump signal at a second frequency and a balanced parametric circuit including a first resonant structure including a first plurality of varactor diodes, and a second resonant structure including a second plurality of varactor diodes, the first and second resonant structures are coupled to form a coupled structure having at least two orthogonal resonant modes, wherein a first resonant mode is resonant at the first frequency of the input signal and a second resonant mode is resonant at the second frequency of the pump signal, wherein the pump signal is used to one of amplify the first signal at the first frequency or mix and amplify the first signal to a frequency higher than the first frequency.

The exemplary embodiments may be further understood with reference to the following description of exemplary embodiments and the related appended drawings, wherein like elements are provided with the same reference numerals. The exemplary embodiments are related to systems and methods for a mode balanced parametric amplifier in a simplified structure for any number of applications. For instance, the exemplary systems and methods can be used in MRI applications, such as an MRI loop coil. Accordingly, the exemplary embodiments may be used as, for example, a Parametric Up Converter or Parametric Down Converter. Additional applications may include interventional or implantable coils, balanced diode mixers, any other field where parametric amplification is of interest.

MRI devices utilize a strong constant magnetic field from a super-conducting magnet in combination with a rotating magnetic field from a radio frequency ("RF") antenna. The constant magnetic field is modified by gradient fields generated from gradient coils. The rotating magnetic field excites nuclear magnetic resonances in the body that generate short term RF signals used to build up a tomographic image. The MRI device uses an array of local coils mounted in close proximity to the target (e.g., a patient) to receive the RF with a maximum possible signal to noise ratio ("SNR").

The MRI devices use coaxial cables to carry the signal from the local coils near the target surface to a receiver, and subsequently, to an image processing unit. Alternatively, the MRI device may utilize a wireless coil system based on a low-noise Parametric Up Converter. The local coil unit may be illuminated by a microware local oscillator field able to provide both the power required for signal gain and the frequency and phase reference for the upconversion.

Figure 2A:
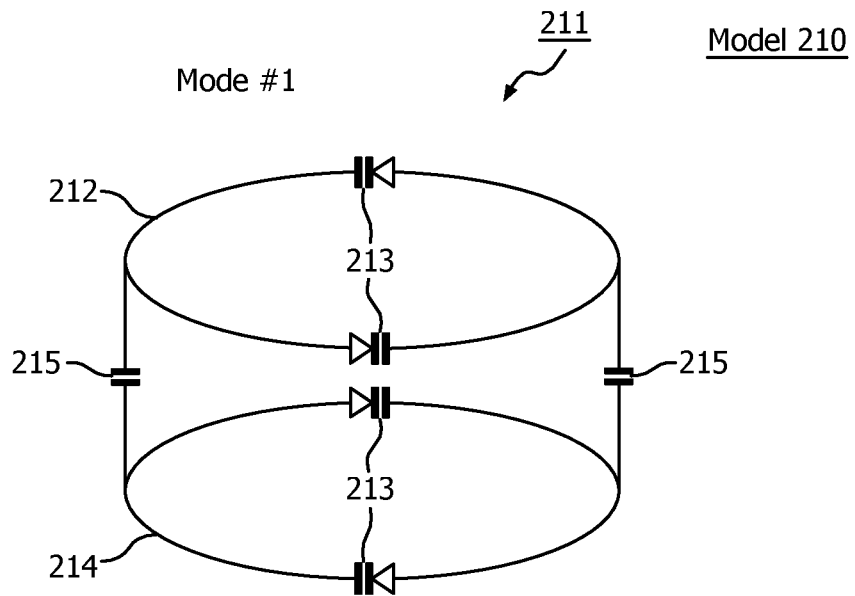
FIGS. 2A-2D show a simplified structure for a mode balanced parametric amplifier having three orthogonal modes according to an exemplary embodiment described herein (Models 210-240).

As will be described in greater detail below, these exemplary systems and methods can use a simplified structure (Model 210), for example, as depicted in FIG. 2A. Specifically, the structure features a balanced parametric system 211 built with resonant structures 212, 214 containing varactor diodes 213 and capacitors 215. By coupling two or more resonant structures 212, 214 with each other via the capacitors 215, a new coupled structure is created that has two or more resonant modes. Accordingly, these modes may then be adjusted so that they are decoupled from each other.

Figure 2B:
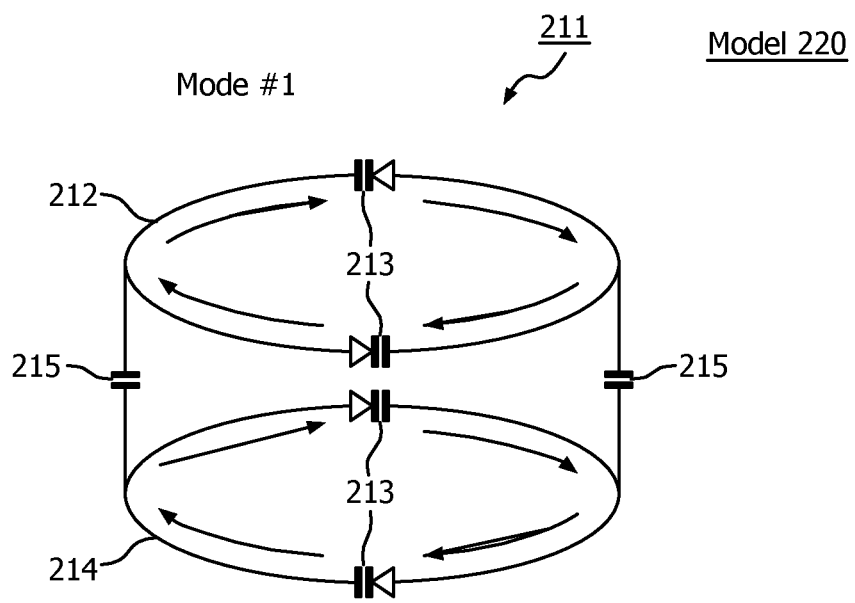
Figure 2C:
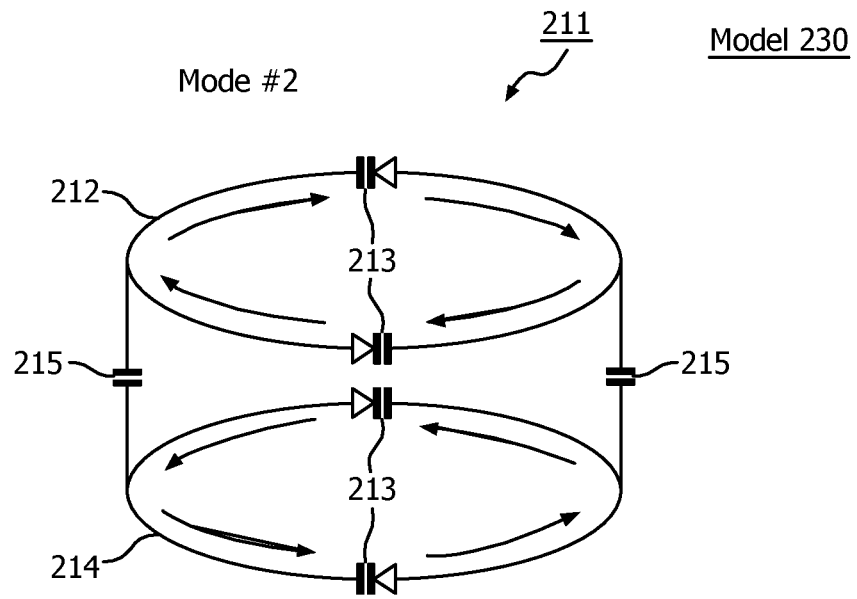
Figure 2D:
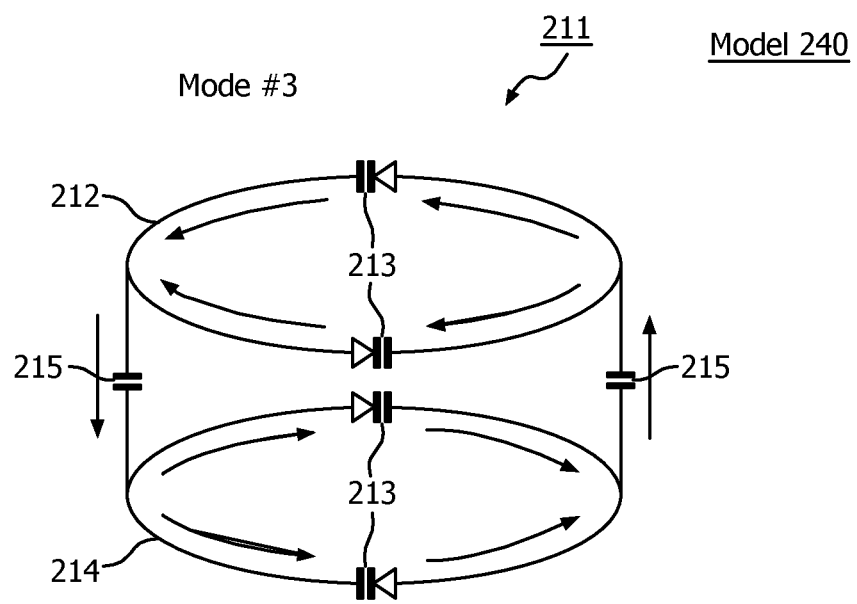

FIGS. 2B-2D represent these exemplary resonant modes. Specifically, FIG. 2B (Model 220) depicts mode #1 that is resonant at input frequency $f_s$, FIG. 2C (Model 230) depicts mode #2 that is resonant at pump frequency $f_p$, and FIG. 2D (Model 240) depicts mode #3 that is resonant at output frequency $f_s+f_p$.

For small signal amplitudes, all three modes (1, 2 and 3) are well isolated. However, if the pump signal is increased so that the varactor diodes 213 start to change their capacitance with the frequency of the pump signal, intermodulation will occur. In other words, that the input signal will be modulated with the pump signal and the product at frequency $f_s+f_p$ will couple into the mode #3, which is tuned to that specific frequency.

According to the exemplary embodiments, the resonant structure may be a combination of conventional resonators consisting of inductive loops and varactor diodes 213 and capacitors 215. In addition, the resonant structure 212, 214 may also include microwave and microstrip resonators for the higher frequencies. For instance, if mode #1 from FIG. 2B (Model 220) also serves as the MRI coil, the resonant structure 212, 214 may be shaped as a typical MRI loop coil. Specifically, by placing two of these loop coils close to each other, a coplanar microstrip transmission path is created that may be used for the pump signal as well as the output signal.

It should be noted that while the embodiments discussed herein relate to recommending medical imaging protocols such as MRIs, one skilled in the art would understand that these exemplary systems and methods for mode balanced parametric amplification can be used in any other field where parametric amplification is of interest, such as balanced diode mixers, interventional and implantable coils, etc. Furthermore, the exemplary systems and methods are not limited to three resonant modes and may utilize any number of modes.

FIGS. 3A-3G shows a simplified structure 211 for applying mode-balanced parametric amplifications to MRI signals according to an exemplary embodiment described herein. For example, if mode #1 from FIG. 2B (Model 220) is tuned to $f_s$ and $f_s$ represents the MRI signal frequency, the parametric amplifier structure 211 can directly detect, amplify and convert the MRI signal. Alternatively, mode #1 can be tuned to the pump frequency and the pump signal can be fed into the parametric amplifier 211 via inductive coupling.

Figure 3A:
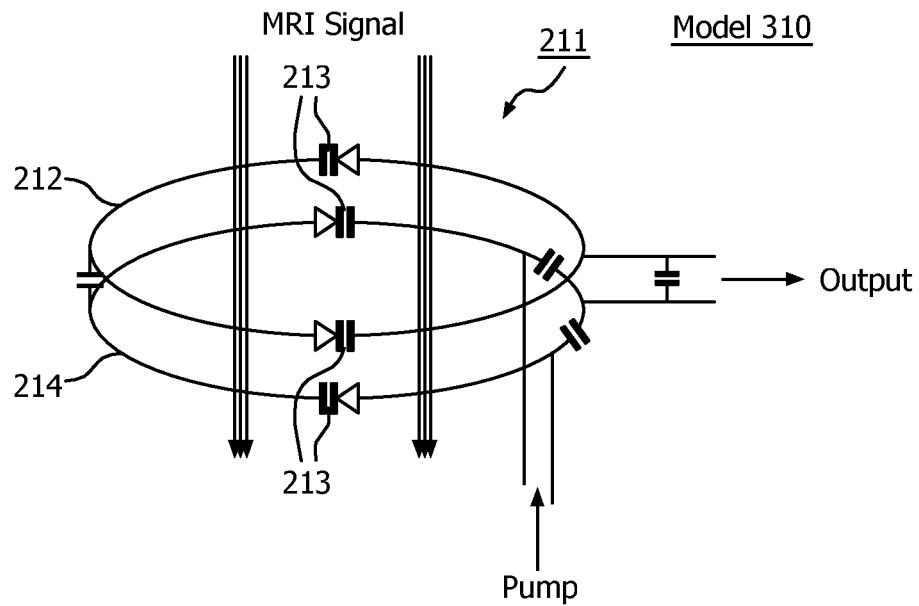
FIGS. 3A-3G show a simplified structure for applying mode-balanced parametric amplifications to MRI signals according to an exemplary embodiment described herein (Models 310-370).

In FIG. 3A (Model 310), the mode #1 of the parametric amplifier structure 211 may be tuned to $f_s$ wherein $f_s$ represents the MRI signal frequency. Specifically, the parametric amplifier structure 211 first detects the MRI signal ($f_s$). Upon detection, the structure 211 amplifies the MRI signal ($f_s$) at a specified pump frequency ($f_p$). The combination of the MRI signal and the pump frequency ($f_s+f_p$) may then serve as the converted output MRI signal.

Figure 3B:
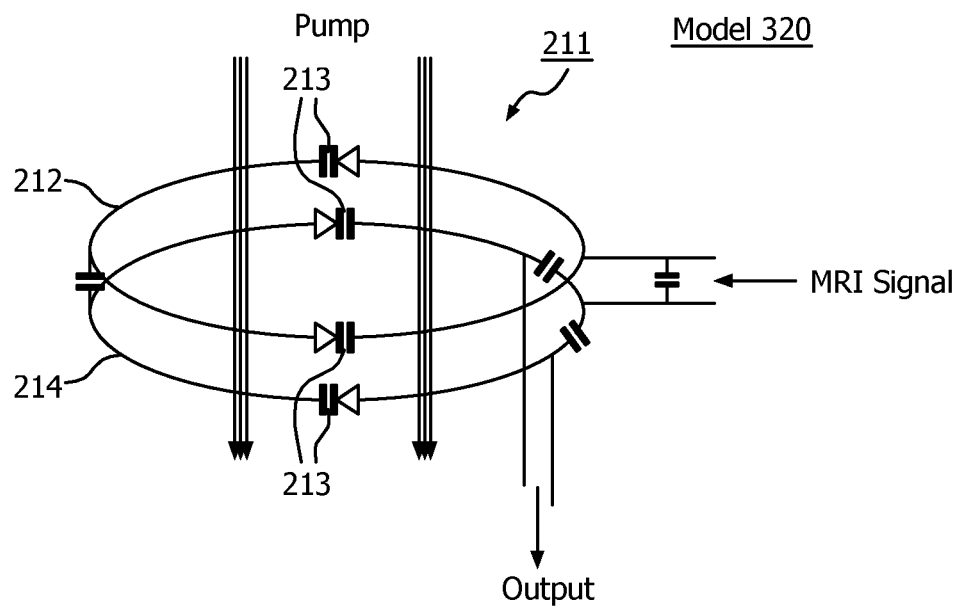

In FIG. 3B (Model 320), the mode #1 of the parametric amplifier structure 211 may be tuned to $f_p$ wherein $f_p$ represents the pump frequency. Specifically, the parametric amplifier structure 211 first detects the pump frequency ($f_p$) fed into the structure 211 via inductive coupling. Upon detection, the structure 211 then amplifies the pump frequency ($f_p$) at a MRI signal frequency ($f_s$) received via an RF antenna. The combination of the pump frequency and the MRI signal ($f_p+f_s$) may then serve as the converted output MRI signal.

Figure 3C:
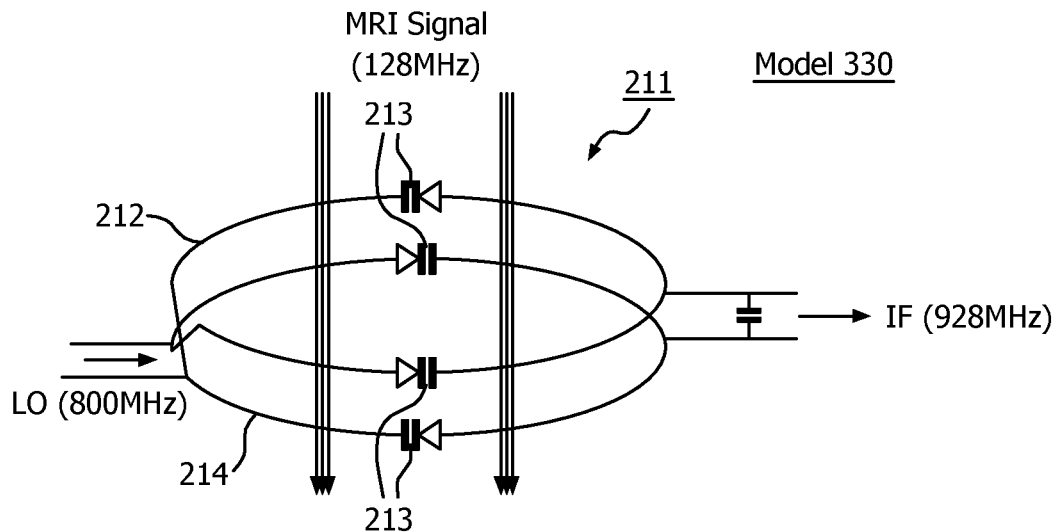

FIG. 3C (Model 330) illustrates exemplary frequency values for combination of the MRI signal and the pump frequency ($f_s+f_p$) may then serve as the converted output MRI signal as discussed in FIG. 3A (Model 310). In this example, the MRI signal frequency ($f_s$) is 128 MHz, while the pump frequency ($f_p$) is 800 MHZ. Upon detecting the MRI signal at 128 MHz, the parametric amplifier 211 may amplify the signal by the 800 MHz pump frequency to generate an output signal ($f_s+f_p$) of 928 MHz.

Figure 3D:
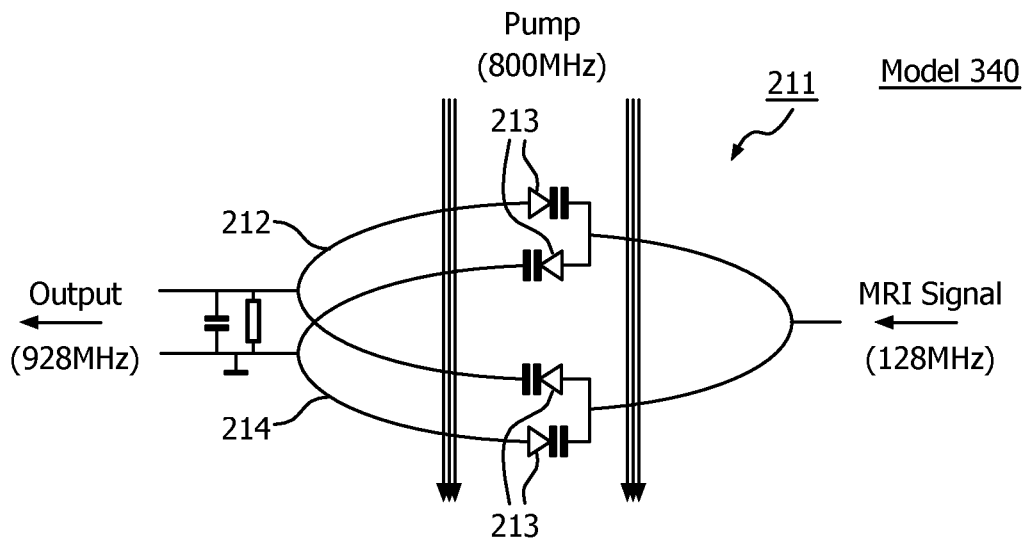

FIG. 3D (Model 340) illustrates exemplary frequency values for combination of the pump frequency and the MRI signal ($f_p+fs$) may then serve as the converted output MRI signal as discussed in FIG. 3B (Model 320). Accordingly, the parametric amplifier 211 may be tuned to the pump frequency ($f_p$) of 800 MHZ and apply the MRI signal of 128 MHz to generate an output signal ($f_p+fs$) of 928 MHz.

Figure 3E:
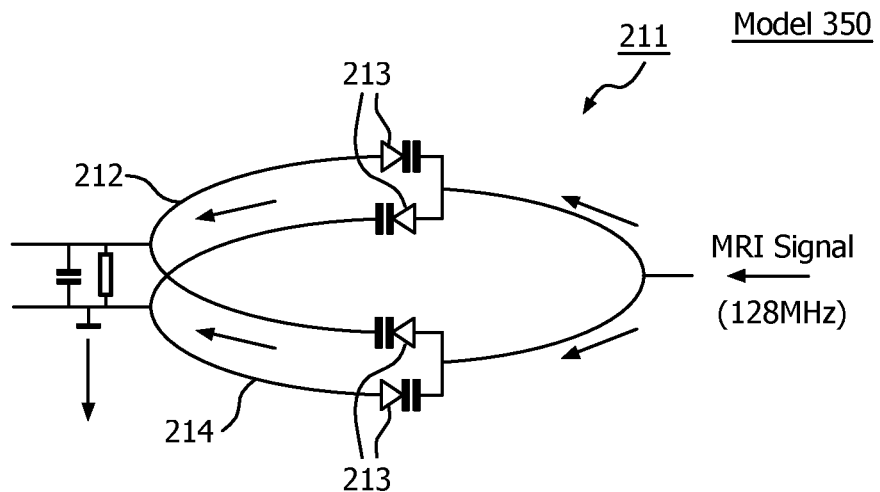
Figure 3F:
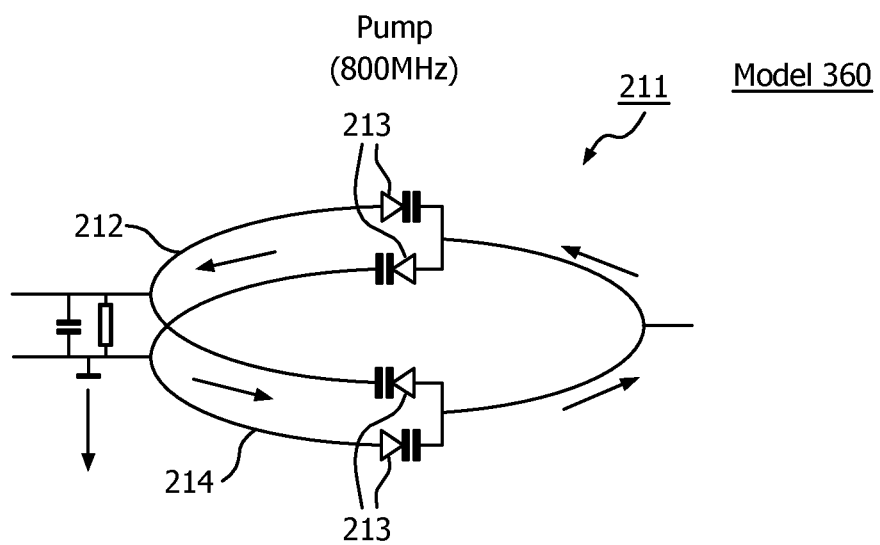
Figure 3G:
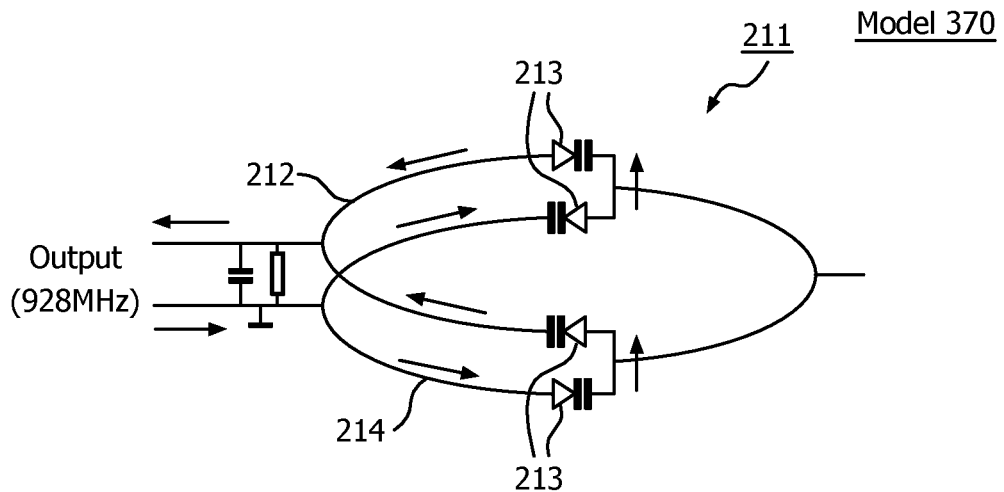

FIG. 3E (Model 350) illustrates the first signal ($f_s$) having a detected MRI signal frequency of 128 MHz. FIG. 3F (Model 360) illustrates the second signal ($f_p$) having an amplified pump signal frequency of 800 MHz. FIG. 3G (Model 370) illustrates the third signal ($f_s+f_p$) having an output signal frequency of 928 MHz.

Figure 4:
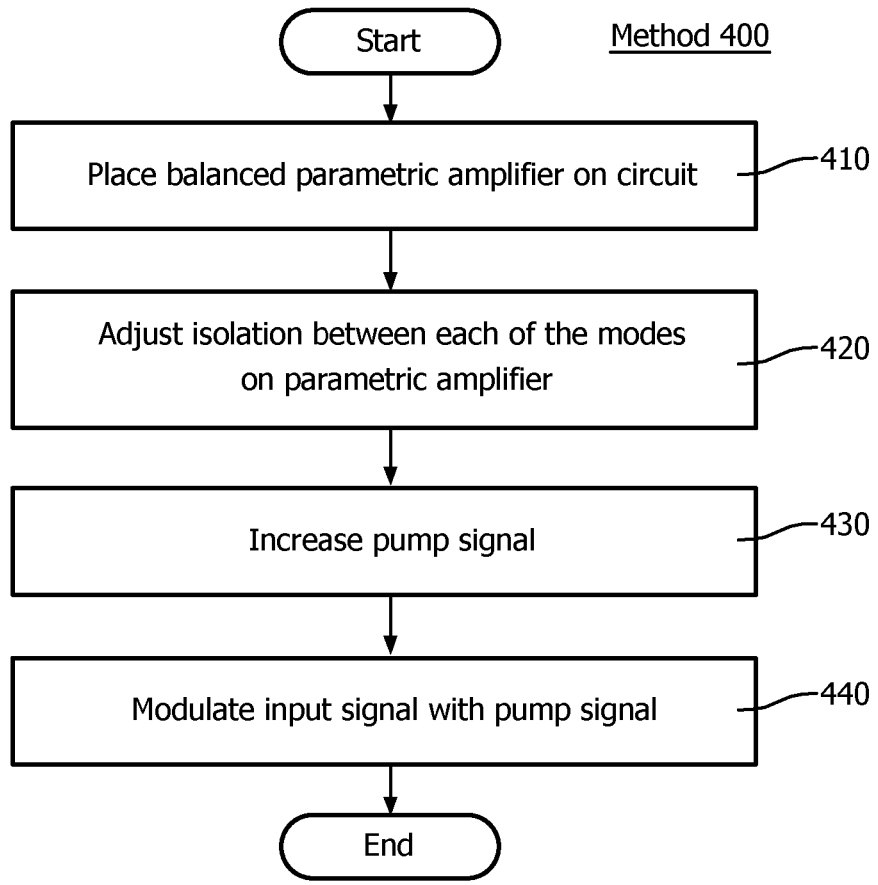
FIG. 4 shows an exemplary method for adjusting the isolation between the exemplary three modes to use the simplified structure as a balanced parametric amplifier according to an exemplary embodiment described herein (Method 400).

FIG. 4 shows an exemplary method (Method 400) for adjusting the isolation between the exemplary three modes to use the simplified structure as a balanced parametric amplifier 211 according to an exemplary embodiment described herein. It should be noted that method will be discussed with reference to simplified structure illustrated in the above-referenced figures.

Beginning with step 410, a balanced parametric amplifier 211 is placed on a circuit having at least two orthogonal modes. Specifically, by coupling two or more resonant structures 212, 214 with each other, a new circuit is created that has at least two resonant modes. For instances, an exemplary circuit may include three resonant modes, wherein any of the three modes may also service as an antenna to either receive or transmit signals. Furthermore, each of the modes exhibits a resonant frequency.

In step 420, isolation between the three resonant modes is adjusted to decouple the modes from each other. Specifically, the isolation is adjusted by tuning the resonant frequencies of the modes to the desired frequencies signals. For instance, mode #1 is resonant at an input signal frequency, mode #3 is resonant at a pump signal frequency and mode #3 is resonant at an output signal frequency.

In step 430, the pump signal is increased such that the varactor diodes 213 change their capacitance with the frequency of the pump signal, thereby inducing intermodulation.

In step 440, the input signal is modulated with the pump signal and the produced output frequency will couple into the resonant mode #3, which is tuned to that specific frequency.

Those skilled in the art will understand from the above description that the exemplary embodiments allow the processing device to operate more efficiently when a user implements the system and methods, e.g., by adjusting a Parametric Up Converter or Parametric Down Converter, by adjusting an MRI coil, by applying the exemplary methods to balanced diode mixers, etc. Furthermore, the exemplary resonant structure may be any combination of resonators including inductive loops, varactor diodes 213 and capacitors 215, microwave and microstrip resonators (e.g., for higher frequencies, etc.)

It is noted that the claims may include reference signs/numerals in accordance with PCT Rule 6.2(b). However, the present claims should not be considered to be limited to the exemplary embodiments corresponding to the reference signs/numerals.

It will be apparent to those skilled in the art that various modifications may be made in the present invention, without departing from the spirit or the scope of the invention. Thus, it is intended that the present invention cover modifications and variations of this invention provided they come within the scope of the appended claims and their equivalents.

What is claimed is:

1. A balanced parametric circuit, comprising:
   a first resonant structure comprising a first plurality of varactor diodes; and
   a second resonant structure comprising a second plurality of varactor diodes, the first and second resonant structures are coupled to form a coupled structure having at least two orthogonal resonant modes, wherein a first resonant mode is resonant at a first frequency of an input signal and a second resonant mode is resonant at a second frequency of a pump signal, wherein the pump signal is used to one of amplify the first signal at the first frequency or mix and amplify the first signal to a frequency higher than the first frequency.

2. The balanced parametric circuit of claim 1, wherein the coupled structure includes a third resonant mode that is resonant at a third frequency of an output signal that is the sum of the first frequency and second frequency.

3. The balanced parametric circuit of claim 1, wherein the first resonant structure further comprises one of an inductive loop, a capacitor, a microwave resonator and a microstrip resonator.

4. The balanced parametric circuit of claim 1, wherein the input signal is an MRI signal and the balanced parametric circuit is tuned to the first frequency to detect, amplify and convert the MRI signal.

5. The balanced parametric circuit of claim 4, wherein the balanced parametric circuit is shaped as an MRI loop coil.

6. The balanced parametric circuit of claim 1, wherein the balanced parametric circuit is tuned to the second frequency of the pump signal that is fed into the balanced parametric circuit via inductive coupling.

7. The balanced parametric circuit of claim 1, wherein the balanced parametric circuit further includes a coplanar transmission path for at least one of the pump signal and the output signal.

8. The balanced parametric circuit of claim 1, wherein the balanced parametric circuit serves as an antenna to receive and/or transmit signals.

9. A system, comprising:
   a signal acquisition arrangement receiving an input signal at a first frequency;
   a signal generator generating a pump signal at a second frequency; and
   a balanced parametric circuit including,
      a first resonant structure comprising a first plurality of varactor diodes, and
      a second resonant structure comprising a second plurality of varactor diodes, the first and second resonant structures are coupled to form a coupled structure having at least two orthogonal resonant modes, wherein a first resonant mode is resonant at the first frequency of the input signal and a second resonant mode is resonant at the second frequency of the pump signal, wherein the pump signal is used to one of amplify the first signal at the first frequency or mix and amplify the first signal to a frequency higher than the first frequency.

10. The system of claim 9, wherein the coupled structure includes a third resonant mode that is resonant at a third frequency of an output signal that is the sum of the first frequency and second frequency.

11. The system of claim 9, wherein the first resonant structure further comprises one of an inductive loop, a capacitor, a microwave resonator and a microstrip resonator.

12. The system of claim 9, wherein the input signal is an MRI signal and the balanced parametric circuit is tuned to the first frequency to detect, amplify and convert the MRI signal.

13. The system of claim 9, wherein the balanced parametric circuit is shaped as an MRI loop coil.

14. The system of claim 9, wherein the balanced parametric circuit is tuned to the second frequency of the pump signal that is fed into the balanced parametric circuit via inductive coupling.

15. The system of claim 9, wherein the balanced parametric circuit further includes a coplanar transmission path for at least one of the pump signal and the output signal.

16. The system of claim 9, wherein the balanced parametric circuit serves as an antenna to receive and/or transmit signals.

* * * * *